(12) United States Patent
Tinnemans et al.

(10) Patent No.: US 9,568,831 B2
(45) Date of Patent: Feb. 14, 2017

(54) LITHOGRAPHIC APPARATUS AND DEVICE MANUFACTURING METHOD

(71) Applicant: ASML Netherlands B.V., Veldhoven (NL)

(72) Inventors: Patricius Aloysius Jacobus Tinnemans, Hapert (NL); Arno Jan Bleeker, Westerhoven (NL)

(*) Notice: Subject to any disclaimer, the term of this patent is extended or adjusted under 35 U.S.C. 154(b) by 310 days.

(21) Appl. No.: 14/361,256

(22) PCT Filed: Dec. 20, 2012

(86) PCT No.: PCT/EP2012/076319
§ 371 (c)(1),
(2) Date: May 28, 2014

(87) PCT Pub. No.: WO2013/107595
PCT Pub. Date: Jul. 25, 2013

(65) Prior Publication Data
US 2014/0354970 A1 Dec. 4, 2014

Related U.S. Application Data

(60) Provisional application No. 61/587,357, filed on Jan. 17, 2012.

(51) Int. Cl.
*G03B 27/32* (2006.01)
*G03B 27/54* (2006.01)
(Continued)

(52) U.S. Cl.
CPC .......... *G03F 7/70058* (2013.01); *G03F 7/704* (2013.01); *G03F 7/70358* (2013.01);
(Continued)

(58) Field of Classification Search
CPC .............. G03F 7/70058; G03F 7/70275; G03F 7/70291; G03F 7/70358; G03F 7/70366; G03F 7/70383; G03F 7/70391; G03F 7/704; G03F 7/70525; G03F 7/7055; G03F 7/70558
(Continued)

(56) References Cited

U.S. PATENT DOCUMENTS 4,090,206 A 5/1978 Pfeifer
4,447,126 A 5/1984 Heidrich
(Continued)

FOREIGN PATENT DOCUMENTS

CN 1332470 1/2002
CN 1871689 11/2006
(Continued)

OTHER PUBLICATIONS

Japanese Office Action dated Jul. 21, 2015 in corresponding Japanese Patent Application No. 2014-552553.
(Continued)

*Primary Examiner* — Colin Kreutzer
(74) *Attorney, Agent, or Firm* — Pillsbury Winthrop Shaw Pittman LLP

(57) ABSTRACT

A lithographic or exposure apparatus has a projection system and a controller. The projection system includes a stationary part and a moving part. The projection system is configured to project a plurality of radiation beams onto locations on a target. The locations are selected based on a pattern. The controller is configured to control the apparatus to operate in a first mode or a second mode. In the first mode the projection system delivers a first amount of energy to the selected locations. In the second mode the projection system delivers a second amount of energy to the selected locations. The second amount of energy is greater than the first amount of energy.

22 Claims, 6 Drawing Sheets

(51) Int. Cl.
  *G03B 27/72* (2006.01)
  *G03F 7/20* (2006.01)
(52) U.S. Cl.
  CPC ...... *G03F 7/70366* (2013.01); *G03F 7/70391* (2013.01); *G03F 7/70525* (2013.01); *G03F 7/70558* (2013.01)
(58) Field of Classification Search
  USPC .............................................. 355/67, 69, 77
  See application file for complete search history.

(56) References Cited

U.S. PATENT DOCUMENTS

| | | | |
|---|---|---|---|
| 4,520,472 | A | 5/1985 | Reno |
| 4,525,729 | A | 6/1985 | Agulnek |
| 4,640,573 | A | 2/1987 | Kataoka |
| 4,780,730 | A | 10/1988 | Dodge |
| 4,796,038 | A | 1/1989 | Allen |
| 4,844,568 | A | 7/1989 | Suzuki |
| 4,864,216 | A | 9/1989 | Kalata |
| 4,952,949 | A | 8/1990 | Uebbing |
| 5,051,762 | A | 9/1991 | Lea |
| 5,216,247 | A | 6/1993 | Wang |
| 5,216,534 | A | 6/1993 | Boardman |
| 5,229,872 | A | 7/1993 | Mumola |
| 5,296,891 | A | 3/1994 | Vogt |
| 5,457,488 | A | 10/1995 | Nakamura |
| 5,481,392 | A | 1/1996 | Damer |
| 5,523,193 | A | 6/1996 | Nelson |
| 5,568,320 | A | 10/1996 | Rees |
| 5,589,973 | A | 12/1996 | King |
| 5,610,754 | A | 3/1997 | Gheen |
| 5,627,627 | A | 5/1997 | Suzuki |
| 5,668,587 | A | 9/1997 | Hammond |
| 5,705,788 | A | 1/1998 | Beyer |
| 5,838,024 | A | 11/1998 | Masuda |
| 5,840,451 | A | 11/1998 | Moore |
| 5,994,006 | A * | 11/1999 | Nishi ...................... G03F 7/701 430/22 |
| 6,037,965 | A | 3/2000 | Gross |
| 6,133,986 | A | 10/2000 | Johnson |
| 6,204,875 | B1 | 3/2001 | De Loor |
| 6,268,613 | B1 | 7/2001 | Cantu |
| 6,310,710 | B1 | 10/2001 | Shahar |
| 6,313,862 | B1 | 11/2001 | Berner |
| 6,466,352 | B1 | 10/2002 | Shahar |
| 6,531,681 | B1 | 3/2003 | Markle |
| 6,559,438 | B1 | 5/2003 | Drobot |
| 6,683,727 | B1 | 1/2004 | Goring |
| 6,721,032 | B2 | 4/2004 | Hasegawa et al. |
| 6,765,647 | B1 | 7/2004 | Nishi |
| 6,795,169 | B2 | 9/2004 | Tanaka |
| 6,967,711 | B2 | 11/2005 | Gui |
| 7,116,402 | B2 | 10/2006 | Gui |
| 7,460,922 | B1 | 12/2008 | Singh et al. |
| 7,969,636 | B2 | 6/2011 | Naito |
| 8,223,317 | B2 | 7/2012 | Hirano |
| 8,937,706 | B2 | 1/2015 | Mulder et al. |
| 2001/0050761 | A1 | 12/2001 | Uzawa |
| 2002/0115021 | A1 | 8/2002 | Piao |
| 2002/0126479 | A1 | 9/2002 | Zhai |
| 2002/0171047 | A1 | 11/2002 | Chan |
| 2003/0043582 | A1 | 3/2003 | Chan |
| 2003/0091277 | A1 | 5/2003 | Mei |
| 2004/0017555 | A1 | 1/2004 | Paufler et al. |
| 2004/0124372 | A1 | 7/2004 | Gil |
| 2004/0135159 | A1 | 7/2004 | Siegel |
| 2004/0257629 | A1 | 12/2004 | Noehte |
| 2005/0053850 | A1 | 3/2005 | Askebjer et al. |
| 2005/0167508 | A1 | 8/2005 | Syms |
| 2005/0270515 | A1 | 12/2005 | Troost et al. |
| 2006/0001855 | A1 | 1/2006 | Lof |
| 2006/0050261 | A1 | 3/2006 | Brotsack |
| 2006/0103719 | A1 | 5/2006 | Katzir |
| 2006/0108508 | A1 | 5/2006 | Khalid |
| 2006/0139600 | A1 | 6/2006 | Tinnemans et al. |
| 2007/0034890 | A1 | 2/2007 | Daschner |
| 2007/0182808 | A1 | 8/2007 | Stiblert |
| 2007/0296936 | A1 | 12/2007 | Kato |
| 2008/0042969 | A1 | 2/2008 | Baker |
| 2008/0047445 | A1 | 2/2008 | Berner |
| 2008/0137051 | A1 | 6/2008 | Maly |
| 2008/0160211 | A1 | 7/2008 | Siegel |
| 2008/0210888 | A1 | 9/2008 | Inoue |
| 2008/0239268 | A1 | 10/2008 | Mulder et al. |
| 2009/0111056 | A1 | 4/2009 | Hendel et al. |
| 2009/0201482 | A1 * | 8/2009 | Ozaki ................. G03F 7/70275 355/71 |
| 2009/0296063 | A1 | 12/2009 | Opower |
| 2010/0127431 | A1 | 5/2010 | Sandstrom |
| 2010/0142757 | A1 | 6/2010 | Sandstrom |
| 2010/0221849 | A1 | 9/2010 | Cheng et al. |
| 2010/0265557 | A1 | 10/2010 | Sallander |
| 2011/0051211 | A1 | 3/2011 | Walther |
| 2011/0188016 | A1 | 8/2011 | De Jager |
| 2011/0242514 | A1 | 10/2011 | Sandström |
| 2012/0307223 | A1 | 12/2012 | Van Zwet et al. |
| 2014/0071421 | A1 | 3/2014 | De Jager et al. |

FOREIGN PATENT DOCUMENTS

| | | |
|---|---|---|
| CN | 101276154 | 10/2008 |
| CN | 101320216 | 12/2008 |
| DE | 4315580 | 11/1994 |
| DE | 4315581 | 11/1994 |
| DE | 19813127 | 10/1998 |
| EP | 1 835 347 | 9/2007 |
| JP | 57-152273 | 9/1982 |
| JP | 06-275936 | 9/1994 |
| JP | 2003-220484 | 8/2003 |
| JP | 2007-108559 | 4/2007 |
| JP | 2011-237819 | 11/2011 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104172 | 9/2011 |
| WO | 2011/104176 | 9/2011 |
| WO | 2011/104180 | 9/2011 |

OTHER PUBLICATIONS

Korean Office Action mailed Nov. 13, 2015 in corresponding Korean Patent Application No. 10-2014-7019408.
Chinese Office Action dated May 21, 2015 in corresponding Chinese Patent Application No. 2012800672718.
International Preliminary Report on Patentability dated Jul. 22, 2014 in corresponding International Patent Application No. PCT/EP2012/076319.
LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.
JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.

(56) References Cited

OTHER PUBLICATIONS

International Search Report mailed Apr. 5, 2013 in corresponding International Patent Application No. PCT/EP2012/076319.

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2012/076319, which was filed on 20 Dec. 2012, which claims the benefit of priority of U.S. provisional application No. 61/587,357, which was filed on 17Jan. 2012, and which is incorporated herein in its entirety by reference.

FIELD

The present invention relates to a lithographic or exposure apparatus and a method of manufacturing a device.

BACKGROUND

A lithographic or exposure apparatus is a machine that applies a desired pattern onto a substrate or part of a substrate. The apparatus may be used, for example, in the manufacture of integrated circuits (ICs), flat panel displays and other devices or structures having fine features. In a conventional lithographic or exposure apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate. In a similar regard, an exposure apparatus is a machine that use a radiation beam in forming a desired pattern on or in a substrate (or a part thereof).

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices, and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

A maskless lithographic apparatus may be provided with, for example, an optical column to create a pattern on a target portion of a substrate. The optical column may be provided with: a self emissive contrast device configured to emit a beam and a projection system configured to project at least a portion of the beam onto the target portion. The apparatus may be provided with an actuator to move the optical column or a part thereof with respect to the substrate. Thereby, there may be relative movement between the beam and the substrate. By switching "on" or "off" the self-emissive contrast device during the movement, a pattern on the substrate may be created.

According to an embodiment of the invention, there is provided a lithographic apparatus, comprising: a projection system, comprising a stationary part and a moving part, configured to project a plurality of radiation beams onto locations on a target that are selected based on a pattern; and a controller configured to control the lithographic apparatus to operate in a first mode or a second mode, wherein in the first mode the projection system delivers a first amount of energy to the selected locations, and in the second mode the projection system delivers a second amount of energy, which is greater than the first amount of energy, to the selected locations.

According to an embodiment of the invention, there is provided a device manufacturing method comprising: using a projection system that comprises a stationary part and a moving part to project a plurality of radiation beams onto locations on a target that are selected based on a pattern; and controlling the lithographic apparatus to operate in a first mode or a second mode, wherein in the first mode the projecting delivers a first amount of energy to the selected locations, and in the second mode the projecting delivers a second amount of energy, which is greater than the first amount of energy, to the selected locations.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. U.S. 61/473,636 and U.S. patent application No. 61/524,190 which are hereby incorporated by reference in their entireties. An embodiment of the present invention, however, may be used with any form of programmable patterning device including, for example, those discussed above.

Figure 1:
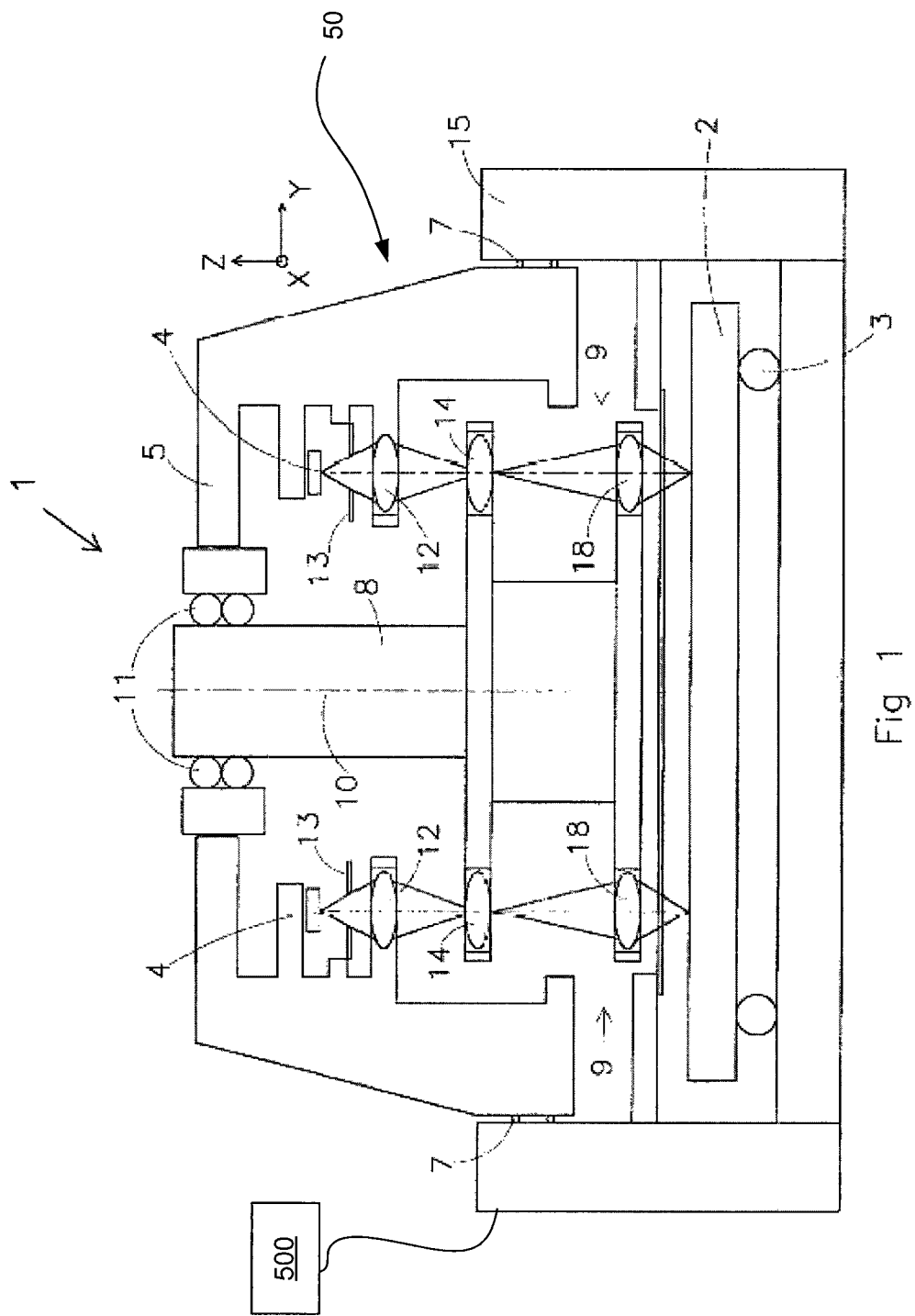
FIG. 1 depicts a part of a lithographic apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
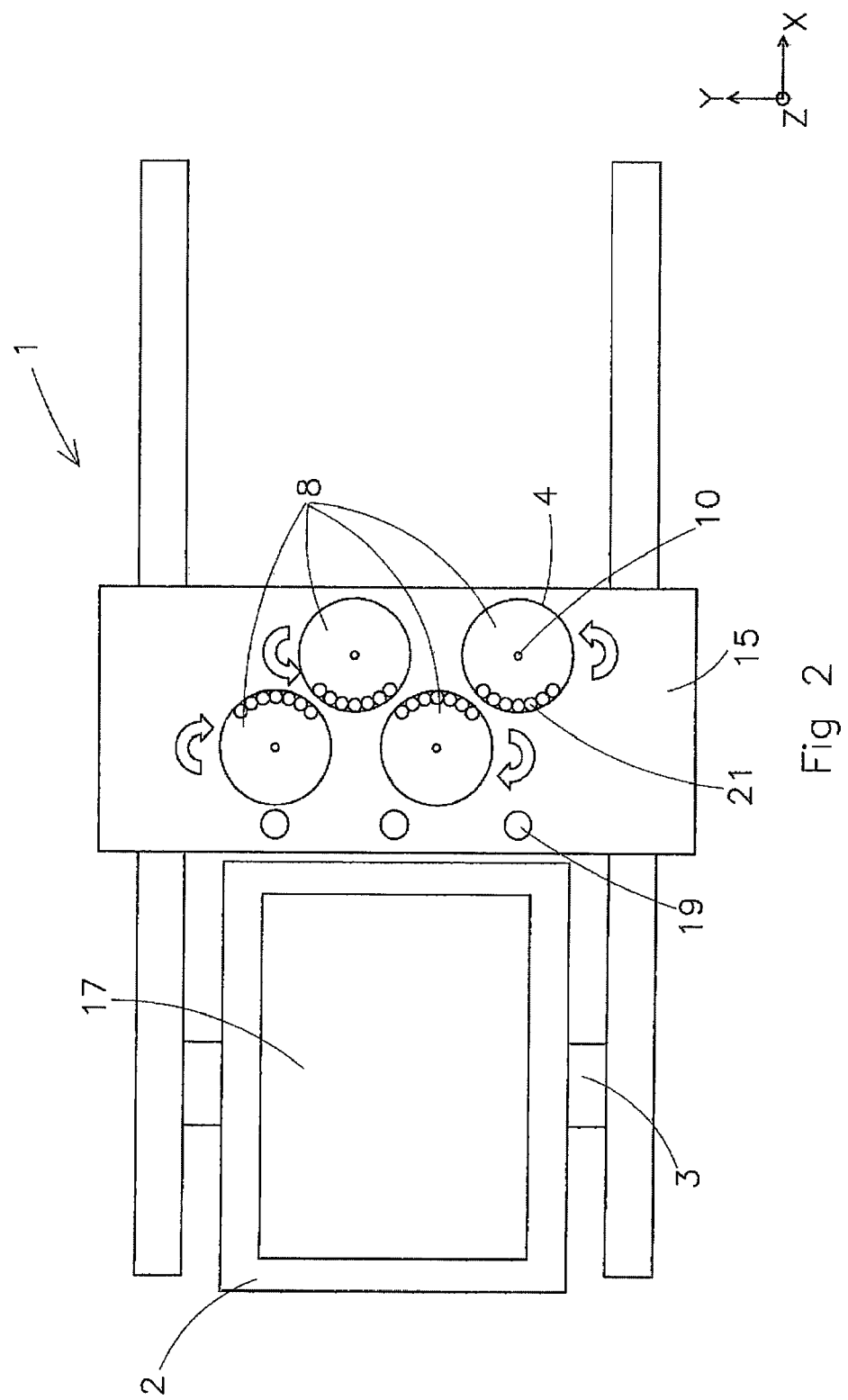
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

A controller 500 shown in FIG. 1 controls the overall operations of the lithographic or exposure apparatus and in particular performs a process described further below. Controller 500 can be embodied as a suitably-programmed general purpose computer comprising a central processing unit, and volatile and non-volatile storage means. The controller may optionally further include one or more input and output devices such as a keyboard and screen, one or more network connections and one or more interfaces to the various parts of the apparatus. A one-to-one relationship between controlling computer and lithographic or exposure apparatus is not necessary. In an embodiment, one computer can control multiple lithographic or exposure apparatuses. In an embodiment, multiple networked computers can be used to control one lithographic or exposure apparatus. The controller 500 may be configured to control one or more associated process devices and substrate handling devices in a lithocell or cluster of which the lithographic or exposure apparatus forms a part. The controller 500 can be configured to be subordinate to a supervisory control system of a lithocell or cluster and/or an overall control system of a fab.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
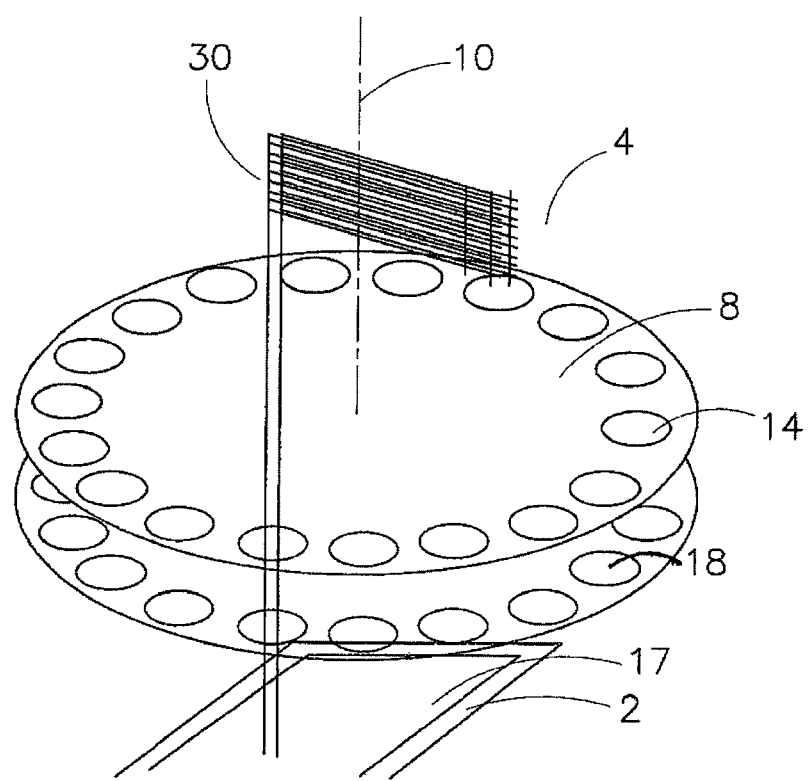
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams is arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
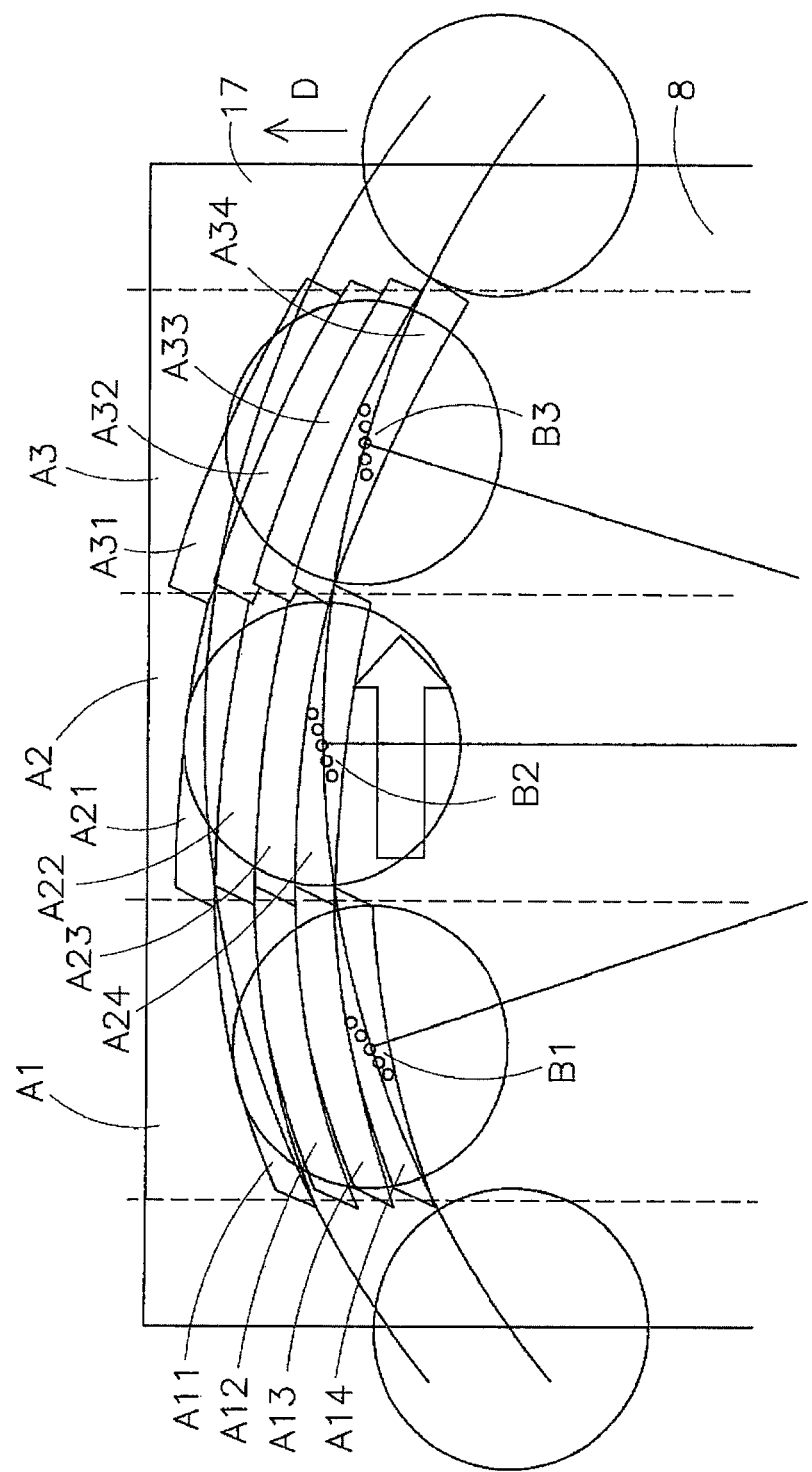
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams is arranged such that each beam overlaps or abuts a scanning path of an adjacent beam.

A further effect of the aspect that multiple beams are projected at a time by the same lens may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
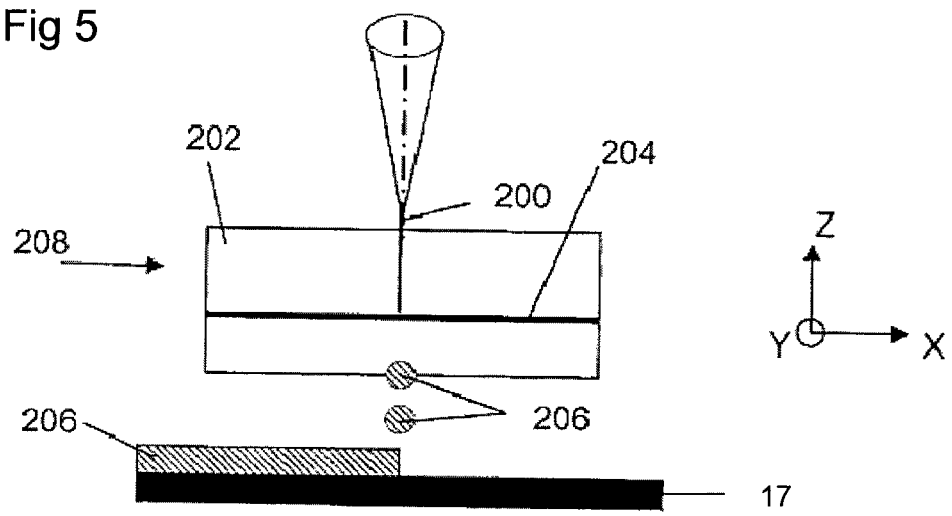
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

A lithographic or exposure apparatus may be designed specifically for use with a particular type of photo resist in which a pattern is to be formed, or a particular type of donor material in which the pattern is to be formed. In this case, if a different type of photo resist or donor material is used with that apparatus, the apparatus may not function correctly. For example, when the pattern is formed on the layer of photo resist, the amount of energy delivered to the locations of the photo resist selected based on the pattern may be insufficient to adequately change one or more chemical properties of the photo resist. Similarly, if a layer of donor material is used, then it is possible that the amount of energy delivered to the donor material is insufficient to melt the donor material so as to manufacture a device.

Therefore, it is desirable to provide a lithographic or exposure apparatus and device manufacturing method that is versatile. In particular, it is desirable to have an apparatus and device manufacturing method that can be used with different types of photo resist or donor material. More particularly, it is desirable to provide an apparatus and device manufacturing method that can be used with different types of photo resist or donor material that involve different amounts of energy in order to form the pattern.

FIG. 1 depicts an embodiment of the invention. The apparatus 1 comprises a projection system 50 that comprises a stationary part and a moving part. The projection system may comprise lenses 12, 14 and 18 as depicted in FIG. 1, for example. The projection system 50 is configured to project a plurality of radiation beams onto locations of a target (for example, on a substrate 17). The locations are selected based on a pattern. The pattern is to be formed on the substrate 17. In an embodiment the pattern is formed in a layer of photoresist material. In an embodiment the pattern is formed in a layer of donor material, which subsequently forms a corresponding pattern in a layer of a device.

The apparatus 1 comprises a controller 500. The controller 500 is configured to control the apparatus 1 to operate in a first mode or in a second mode. In the first mode the projection system 50 delivers a first amount of energy to the selected locations on the target (e.g., on substrate 17). In the second mode the projection system 50 delivers a second amount of energy to the selected locations on the target (e.g., on substrate 17). The second amount of energy is greater than the first amount of energy.

The apparatus 1 is versatile in that it can produce a pattern on a substrate 17 at a plurality of different dose levels. Here, the term "dose" is used to refer to the total amount of energy that is delivered to the selected locations on the target (e.g., substrate 17). The apparatus 1 thus supports a range of dose levels.

In an embodiment, the apparatus 1 may be used to form a pattern on a first substrate in the first mode. The same apparatus 1 can be used to form a pattern on a different substrate having different dose requirements using the second mode. For example, the second substrate may comprise a layer of photoresist that requires a greater amount of energy in order for the pattern to be formed in the photoresist. It may be desirable to use a different type of photoresist if it is cheaper, for example. By using a cheaper photo resist and the apparatus 1 in the second mode, the manufacturing costs for producing devices may be reduced.

If a layer of donor material is used, then donor material that requires a greater amount of energy in order to be melted so as to form a corresponding pattern in a device can be used by operating the apparatus 1 in the second mode. The motivation for using a different type of donor material may be reduced cost, increased availability or safety, for example.

By switching operation of the apparatus 1 between the first mode and the second mode, the dose level to form the pattern can be varied. In an embodiment the amount of energy delivered to the selected locations on the target can be varied within a continuous range. In an embodiment, the controller 500 can control the amount of energy delivered to the selected locations on the target to be at any level within a range of from the amount of energy delivered in the first mode to about 10 times the amount of energy delivered in the first mode. The amount of energy that can be delivered to the selected locations is not particularly limited.

In an embodiment the controller 500 is configured to control the apparatus 1 to deliver an amount of energy to the selected locations that is selected from a range of discrete values. In an embodiment, in the second mode the projection system 50 delivers a second amount of energy that is an integer number of times the first amount of energy delivered in the first mode. Whether the range of possible values for the second amount of energy is continuous or discrete depends on how an embodiment of the present invention is implemented, as will become clear below. In an embodiment the controller 500 is configured to control the apparatus 1 such that the second amount of energy is greater than the first amount of energy by up to two times, by up to four times or by up to eight times.

There are several different non-limiting ways of implementing the second mode of operation of the apparatus 1. These are described below. Any of these methods can be used in combination with each other.

The second mode may be implemented, for example, by reducing the speed at which the substrate 17 scans relative to the projection system 50. As depicted in FIG. 1, the apparatus 1 comprises a substrate support, such as a substrate table 2, for example. The substrate table 2 is configured to support the substrate 17. The substrate table 2 is configured to move the substrate relative to the projection system 50 in a scan direction. For example in FIG. 2 the substrate table 2 may move from the left side to the right side of the projection system 50. In this case, the scan direction is the +X direction. As the substrate 17 scans along the scan direction, the projection system 50 can project onto successive scanning areas A11-A14, as shown in FIG. 4.

In the first mode the substrate 17 moves relative to the projection system 50 at a first speed. In the second mode the substrate 17 moves relative to the projection system 50 at a second speed. In an embodiment the second speed is lower than the first speed.

Figure 6:
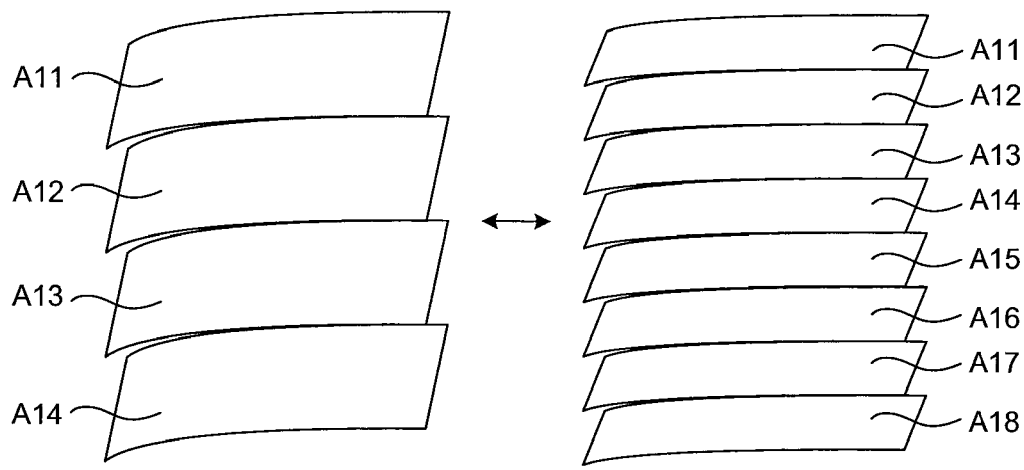
FIG. 6 depicts a schematic top view of projections by the lithographic apparatus onto part of a substrate according to an embodiment of the invention.
Figure 7:
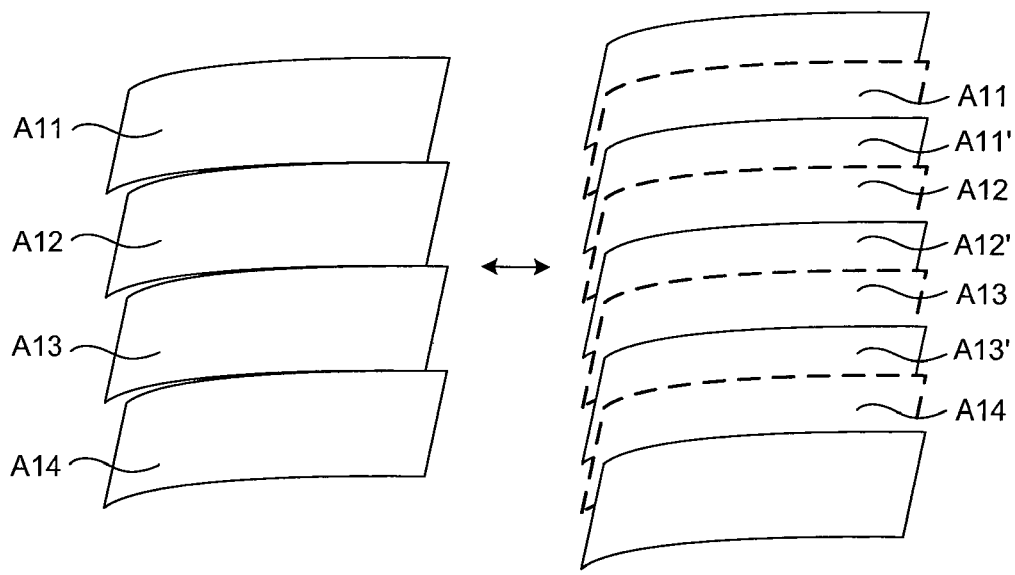
FIG. 7 depicts a schematic top view of projections by the lithographic apparatus onto part of a substrate according to an embodiment of the invention.
Figure 8:
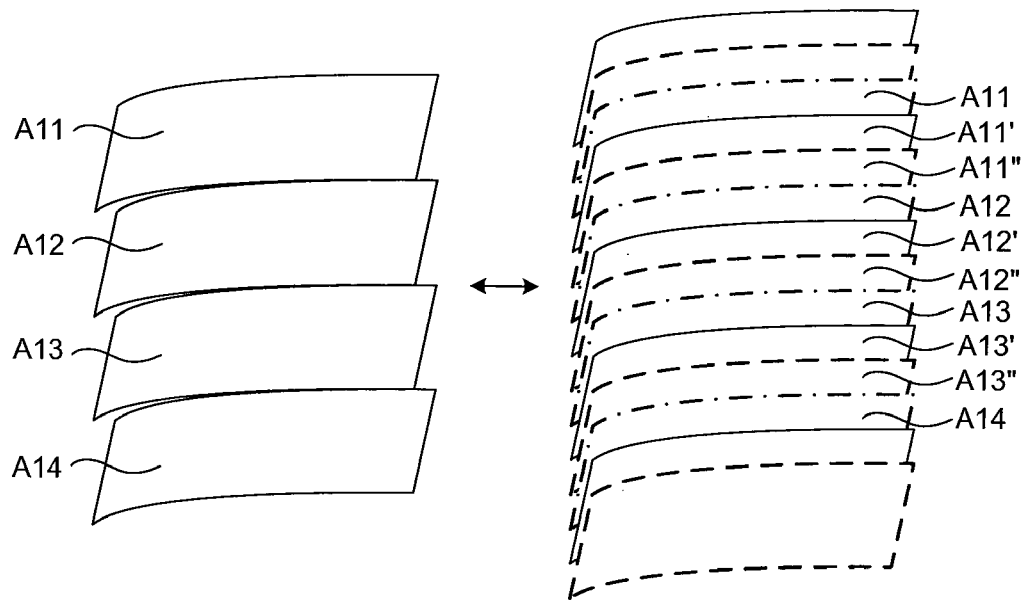
FIG. 8 depicts a schematic top view of projections by the lithographic apparatus onto part of a substrate according to an embodiment of the invention.

In an embodiment the lower scan speed of the second mode results in the grid pitch between scanning areas A11-A14 being smaller than in the first mode. FIG. 6 depicts scanning areas A11-A18 in the second mode having a reduced grid pitch relative to areas A11-A14 in the first mode. In FIGS. 6 to 8, the first mode is shown on the left hand side and the second mode is shown on the right hand side.

In the example of FIG. 6, the second speed is two times lower than the first speed. As a result the number of scanning areas in the second mode is two times the number of scanning areas in the first mode. In the second mode, the radiation beams projected by the projection system 50 onto each scanning area A11-A14 is effectively more concentrated than in the first mode. This has the effect of increasing the amount of energy delivered to the selected locations on the substrate 17.

Substrates requiring different dose levels of radiation can be used with this apparatus 1. Reducing the scan speed of the substrate 17 allows a continuous range of dose levels to be implemented by the same apparatus 1.

The controller 500 controls the apparatus 1 such that the projection system 50 projects radiation beams onto the correct selected locations on the substrate 17. This involves computation of when the self-emissive contrast device 4 is turned on and off. This depends on the scan speed of the substrate 17 and the speed of movement of the movable part of the projection system 50.

The reduced grid pitch in the second mode depicted in FIG. 6 results in a greater number of data points to be calculated by the controller 500 in order to help ensure that the pattern is correctly formed on the substrate 17 by the radiation beams. The average distance between spot positions that can be formed by the radiation beams is reduced in the second mode compared to in the first mode.

It is desirable to provide a apparatus 1 and device manufacturing method that supports variable dose levels, without substantially increasing the computations to be performed by the controller 500.

In the first mode the projection system 50 projects the plurality of radiation beams onto the selected locations at a first rate. In the second mode the projection system 50 projects the plurality of radiation beams onto the selected locations at a second rate. In an embodiment the second rate is lower than or equal to the first rate.

In an embodiment the second mode comprises a first sub-mode. In the first sub-mode the second rate is substantially equal to the first rate. This means that for a given pattern, the rate of projection by the projection system 50 is the same for the first mode and the second mode. In an embodiment, the rate of projection by the projection system 50 corresponds to the speed at which the moving part of the projection system 50 moves. In the case that the moving part is rotatable, the speed of rotation may correspond to the rate of projection. Of course, as the speed at which the moving part is varied, the timings at which the self-emissive contrast device 4 is turned on and off must change accordingly such that the correct selected locations on the target are irradiated.

In the first sub-mode the second speed (i.e. scan speed in the second mode) is lower than the first speed by an integer factor such that each scanning area A11-A14 partially overlaps an integer number of other scanning areas. The amount of energy delivered to the target (e.g., substrate 17) can be varied by whole integer factors by keeping the projection rate (e.g. speed of the moving part of the projection system 50) equal between the first mode and the second mode, and varying the target (e.g., substrate 17) scan speed by an exact integer ratio. This results in a number of interlaced images. The images partially overlap each other. Each image may correspond to a scanning area A11-A14.

FIG. 7 depicts an embodiment in which in the second mode the second speed is two times lower than the first speed. The second speed is an integer factor of two less than the first speed. This results in each scanning area A11-A14 overlapping other scanning areas. Each region of the target on which the pattern is provided corresponds to two different scanning areas. This overlap effectively doubles the dose of radiation for the pattern.

An advantage of increasing the dose by decreasing the target (e.g., substrate) scan speed by an exact integer ratio is that the computation by the controller 500 is not substantially increased. It may be only necessary to change the calculation logistics of the data points, rather than calculating a whole new set of data points. This is because the relative spot positions produced by the radiation beams is the same in the second mode as in the first mode. This is a difference from the method depicted in FIG. 6 in which the relative spot positions are different in the second mode from the first mode.

The feature that the computation in the second mode is substantially the same as in the first mode can be understood schematically from FIG. 7. The image corresponding to scanning area A11' has half of the image in scanning area A12 and half of the image in scanning area A11. Similarly, the image corresponding to scanning area A12' has half of the image in scanning area A12 and half of the image in scanning area A13. The image corresponding to scanning area A13' has half of the image in scanning area A13 and half of the image in scanning area A14. Hence, it may not be necessary to recalculate a new set of data points for the image in scanning area A11', A12', A13', A14', etc. Instead it may only be necessary to adjust the calculation logistics of the data points.

FIG. 8 depicts an example in which the second speed is lower than the first speed by a factor of 3. In this case, each region of the substrate on which the pattern is to be formed corresponds to three different scanning areas. This allows the effective dose of the pattern to be increased by a factor of 3 without substantially increasing the computations.

The image corresponding to scanning area A11' has two thirds of the image in scanning area A11 and one third of the image in scanning area A12. The image corresponding to scanning area A11" has two thirds of the image in scanning area A12 and one third of the image in scanning area A11. The image corresponding to scanning area A12' has two thirds of the image in scanning area A12 and one third of the image in scanning area A13. The image corresponding to scanning area A12" has two thirds of the image in scanning area A13 and one third of the image in scanning area A12. The image corresponding to scanning area A13' has two thirds of the image in scanning area A13 and one third of the image in scanning area A14. The image corresponding to scanning area A13" has two thirds of the image in scanning area A14 and one third of the image in scanning area A13.

In an embodiment the second mode comprises a second sub-mode. In the second sub-mode the second rate is lower than the first rate by a slow-down factor. In the second sub-mode the second speed is lower than the first speed by the same slow-down factor. In the second sub-mode all of the mechanical movements of the apparatus 1 are effectively slowed down by the slow-down factor. The radiation per unit time delivered to the substrate remains substantially equal for the first mode and the second sub-mode. This is because the intensity of radiation emitted by the self-emissive contrast device 4 is substantially the same in the first mode as in the second mode.

In the second sub-mode more radiation is delivered to the selected locations on the target than in the first mode. The spot positions to form the pattern are the same in the first mode and in the second sub-mode of the second mode. This means that the computations for the second sub-mode are exactly the same as for the first mode. There is no increase of the computations to performed in the second sub-mode compared to the first mode.

In an embodiment in the second sub-mode the speed of the moving part of the projection system 50 is lower than in the first mode by the slow-down factor. In an embodiment in the second sub-mode the firing rate for the self-emissive contrast device 4 is lower than in the first mode by the slow-down factor, maintaining the duty ratio of the self-emissive contrast device 4. This is one way of having the second rate lower than the first rate by the slow-down factor.

In an embodiment the second mode comprises a third sub-mode. In the third sub-mode the second rate is lower than the first rate by a slow-down factor. The projection rate for the third sub-mode may be implemented in the same way as the projection rate for the second sub-mode, for example by having a lower speed of the moving part of the projection system 50 and a lower firing rate of the self-emissive contrast device 4.

In the third sub-mode the second speed is lower than the first speed by the product of the slow-down factor and an integer factor, whereby each scanning area partially overlaps and integer number of other scanning areas A11-A14.

The third sub-mode may be considered as a hybrid combination of the first sub-mode and the second sub-mode described above. Examples of how the first sub-mode, the second sub-mode and the third sub-mode may be used are outlined below.

If the dose level in the second mode is desired to be an integer factor greater than the dose level in the first mode, then this may be implemented by the first sub-mode. For example, if the second mode is to provide a dose level that is n times greater than the dose level provided by the first mode, then the target (e.g., substrate) scan speed may be n times lower in the second mode than in the first mode, where n is a positive non-zero integer.

The second sub-mode can be used to effect a dose level in the second mode that is greater than the dose level in the first mode by an arbitrary factor. The ratio between the dose level of the second mode and the dose level of the first mode does not have to be an integer when using the second sub-mode. For example, if a dose level is 1.25 greater in the second mode than in the first mode, then the controller 500 can control the apparatus 1 such that the second rate is lower than the first rate by a slow-down factor of 1.25 and can control the apparatus 1 such that the second speed is lower than the first speed by the slow-down factor of 1.25.

When using the second sub-mode of the second mode, the slow-down factor can take any value greater than 1. In an embodiment, the slow-down factor may take any value within a range having 1 at the lower end of the range. In order to implement the upper end of the range, the apparatus 1 should be able to support a correspondingly greater ratio of possible projection rates. It may be mechanically difficult to support a very high ratio of possible projection rates. In an embodiment, the slow-down factor takes any value within the range of from 1 to 2. In this case, if the dose level in the second mode is to be greater than two times the dose level provided in the first mode, then the third sub-mode may be used.

For example, if the second mode is to provide a dose level that is 2.5 times greater than the dose level provided in the first mode, then the second rate may be lower than the first rate by a slow-down factor of 1.25 and the second speed may be lower than the first speed by a factor of 2.5 (which is the product of the slow-down factor of 1.25 and an integer factor of 2).

For some dose level differences between the first mode and the second mode, there may be more than one way to implement that factor. For example, the second mode may provide a dose level that is a factor of 3.6 times greater than the dose level provided in the first mode. In this case, the second sub-mode may be used in principle. The apparatus 1 then should support a projection rate ratio of at least 3.6.

The factor of 3.6 may be implemented using the third sub-mode. Within the third sub-mode, there is more than one way of implementing the factor of 3.6. For example, the second rate may be lower than the first rate by a slow-down factor of 1.8 and the second speed may be lower than the first speed by a factor of 3.6 (which is the product of the slow-down factor of 1.8 and the integer factor of 2). As an alternative, the second rate may be lower than the first rate by a slow-down factor of 1.2 and the second speed may be lower than the first speed by a factor of 3.6 (which is the product of the slow-down factor of 1.2 and an integer factor of 3).

The dose level may be varied by varying the intensity of the radiation beams that are projected onto the target. For example, the duty ratio of the self-emissive contrast device 4 may be varied. It is often desirable for the self-emissive contrast device 4 to be run at its maximum output intensity. An advantage of this is that it improves the throughput of the apparatus. In an embodiment, the self-emissive contrast device 4 may be used at an intensity output that is lower than the maximum output intensity when the apparatus is operating in the second mode to provide a higher dose level than in the first mode.

In an embodiment the second mode comprises a fourth sub-mode. In the fourth sub-mode the second speed is lower than the first speed by an integer factor and a second intensity of radiation is lower than a first intensity of radiation. The first intensity of radiation is the intensity of the radiation beams projected onto the target in the first mode. The second intensity of radiation is the intensity of the radiation beams projected onto the target in the fourth sub-mode of the second mode.

An example of the fourth sub-mode of the second mode will now be given. In the example, the dose level in the second mode is desired to be 1.4 times the dose level in the first mode. In this case, the second speed may be slower than the first speed by an integer factor 2. In other words the second speed is half the first speed. The second intensity of radiation may be 0.7 times the first intensity of radiation. This results in the dose level in the second mode being 1.4 times the dose level in the first mode. The pattern on the target is formed by two interlaced images, each image having an intensity of 0.7 such that the combined intensity is 1.4.

In the fourth sub-mode the rate of projection may be equal to that in the first mode. Hence it may not be necessary for the apparatus to be able to support varying projection rates.

In an embodiment the second mode comprises a fifth sub-mode. In the fifth sub-mode the controller 500 is configured to control, for example, the substrate support to repeat the substrate movement relative to the projection system 50 so as to control the number of times that each scanning area A11-A14 is irradiated by the projection system 50. In the fifth sub-mode of the second mode the intensity of radiation of the projected radiation beams is varied between scans.

For example using the fifth sub-mode the dose level in the second mode can be provided to be 1.4 times the dose level in the first sub-mode. In the first scan, namely the first movement of the target relative to the projection system 50, the intensity of radiation of the projected radiation beams may be at its maximum level. In the repeat movement of the target relative to the projection system 50, the intensity of radiation of the projected radiation beams may be 40% of the maximum level. In other words, a dose of 1.0 and of 0.4 are delivered to the target by the apparatus. This results in a combined pattern intensity of 1.4 applied to the target.

In an embodiment the controller 500 is configured to control the substrate support 2 to repeat the substrate movements relative to the projection system 50. This is to control the number of times that each scanning area A11-A14 is irradiated by the projection system 50.

By repeating the scanning motion, the effective dose level of the pattern on the target can be increased by an integer factor equal to the number of times that the scan is repeated. This is another way of providing a greater dose level in the second mode than in the first mode. Repetition of the scan can be used independently of the sub-modes described above in order to effect a second mode that provides a dose level that is an integer number of times greater than the dose level provided in the first mode. In an embodiment, repetition of the scan is used in combination with any of the first sub-mode, the second sub-mode and/or the third sub-mode in order to provide the dose level in the second mode.

An advantage of repeating the scan is that the apparatus 1 may not need to support a wide range of target scan speeds. For example, instead of having a second speed that is lower than the first speed by a factor of 3.6, the second speed in the second mode can be lower than the first speed by a factor of only 1.2 and the scan can be performed three times so as to achieve the dose level.

In an embodiment when a scan is repeated, the radiation beams may be projected onto the target (so as to overlie previously projected beams) during a backward scanning motion, or during a forward scanning motion.

In an embodiment in each region of overlap between the scanning areas A11-A14, all of the selected locations are irradiated by an integer number of times. This provides consistency of dose level in all parts of the pattern.

In an embodiment each scanning area A11-A14 substantially abuts at least one other scanning area A11-A14 in the scan direction. This helps ensure that there are no gaps in the formed pattern.

In an embodiment each scanning area A11-A14 has substantially the same length in the scan direction.

In an embodiment in the first mode there is substantially no overlap between any of the scanning areas. There may be a very small, i.e. negligible, area of overlap. For example as mentioned above there may be overlap of approximately 10% of the width of one radiation beam. However, the area of overlap in the first mode is less than the width of one radiation beam such that it is negligible.

In an embodiment the controller 500 is configured to control, for example, the substrate support such that the substrate moves relative to the projection system 50 at a substantially constant speed during irradiation of substantially all of the scanning areas A11-A14. The substrate scan speed is substantially constant throughout a single scan. This simplifies the computations to be made by the controller 500 in order to help ensure that each of the radiation beams is incident on the target at the correct positions so as to form the pattern.

In an embodiment the controller 500 is configured to control the apparatus 1 such that the projection system 50 projects each plurality of the radiation beams onto any previously irradiated selected location in each scanning area A11-A14. In each region of overlap between two scanning areas A11-A14, the projection system 50 projects radiation beams onto only those sections of the region of overlap that have already been irradiated. This helps ensure that the dose level is consistent across the whole pattern. If the whole scan is being repeated, then the projection system 50 projects the radiation beams onto the already irradiated selected locations.

An advantage of re-writing over previously irradiated locations is a reduction in the width of lines that may be formed as part of the pattern. This is because the actual position of lines formed may differ compared to a target position. If the line is written twice and the positioning error for both times of writing is independent of each other then there will be a reduction in energy delivered to the outer portions of the line. This may result in a line that effectively has a decreased width if the outer portions of the line are irradiated to a level that is less than the threshold required to form the pattern.

In an embodiment the controller 500 can switch between the first mode and the second mode inline. In an embodiment the controller 500 can switch between sub-modes of the second mode inline. This is made easier by a feature that the computational overhead is not substantially increased when switching between modes.

In an embodiment calibration data may be acquired and taken into account by the controller 500 when the controller 500 switches between modes. This helps to ensure that the radiation beams are projected onto the correct selected locations of the target.

In an embodiment the apparatus 1 comprises a programmable patterning device, configured to provide the plurality of radiation beams. In an embodiment the programmable patterning device comprises controllable element to selectively provide the beams of radiation. In an embodiment the programmable patterning device comprises a plurality of self-emissive contrast devices 4.

In an embodiment the moving part of the projection system 50 is configured to rotate relative to the stationary part. The moving part may take the form of a rotatable wheel, for example. However, other configurations are also possible such as linear movement of the moving part.

In accordance with a device manufacturing method, a device, such as a display, integrated circuit or any other item may be manufactured from the substrate on which the pattern has been projected.

Although specific reference may be made in this text to the use of a lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The descriptions above are intended to be illustrative, not limiting. Thus, it will be apparent to one skilled in the art that modifications may be made to the invention as described without departing from the scope of the claims set out below.

The invention claimed is:

1. An exposure apparatus, comprising:
   a projection system, comprising a stationary part and a moving part, configured to project a plurality of radiation beams onto locations on a target that are selected based on a pattern;
   a substrate support configured to support a substrate having the target and move the substrate relative to the projection system in a scan direction such that the projection system can project onto successive scanning areas of the substrate, and
   a control system configured to control the apparatus to operate in a first mode or a second mode,
   wherein in the first mode the projection system delivers a first amount of energy to the selected locations, and in the second mode the projection system delivers a second amount of energy, which is greater than the first amount of energy, to the selected locations,
   wherein in the first mode the substrate moves relative to the projection system at a first speed, and in the second mode the substrate moves relative to the projection system at a second speed, which is lower than the first speed, and
   wherein in the first mode the projection system projects the plurality of radiation beams onto the selected locations at a first rate, and in the second mode the projection system projects the plurality of radiation beams onto the selected locations at a second rate, wherein (i) the second rate is lower than the first rate, or (ii) the second rate is substantially equal to or lower than the first rate and the second speed is lower than the first speed by an integer factor, or (iii) the second rate is substantially equal to or lower than the first rate and an intensity of radiation of the radiation beams projected onto the substrate is lower in the second mode than in the first mode.

2. The apparatus of claim 1, wherein the second rate is lower than the first rate.

3. The apparatus of claim 1, wherein the second mode comprises a first sub-mode in which the second rate is substantially equal to the first rate and the second speed is lower than the first speed by the integer factor such that each scanning area partially overlaps an integer number of other scanning areas.

4. The apparatus of claim 1, wherein the second mode comprises a second sub-mode in which the second rate is lower than the first rate by a slow-down factor and the second speed is lower than the first speed by the slow-down factor.

5. The apparatus of claim 1, wherein the second mode comprises a third sub-mode in which the second rate is lower than the first rate by a slow-down factor and the second speed is lower than the first speed by the product of the slow-down factor and an integer factor, wherein each scanning area partially overlaps an integer number of other scanning areas.

6. The apparatus of claim 1, wherein the second mode comprises a fourth sub-mode in which the second speed is lower than the first speed by an integer factor and the intensity of radiation of the radiation beams projected onto the substrate is lower in the fourth sub-mode than in the first mode.

7. The apparatus of claim 1, wherein the second mode comprises a fifth sub-mode in which the control system is configured to control the substrate support to repeat the substrate movement relative to the projection system so as to control the number of times that each scanning area is irradiated by the projection system, wherein an intensity of radiation of the radiation beams projected onto the substrate is varied between scans.

8. The apparatus of claim 1, wherein in the second mode the control system is configured to control the substrate support to repeat the substrate movement relative to the projection system so as to control the number of times that each scanning area is irradiated by the projection system.

9. The apparatus of claim 3, wherein in each region of overlap all of the selected locations are irradiated an integer number of times.

10. The apparatus of claim 1, wherein each scanning area substantially abuts at least one other scanning area in the scan direction.

11. The apparatus of claim 1, wherein each scanning area has substantially the same length in the scan direction.

12. The apparatus of claim 1, wherein in the first mode there is substantially no overlap between any of the scanning areas.

13. The apparatus of claim 1, wherein the moving part is configured to rotate relative to the stationary part.

14. A device manufacturing method comprising:
using a projection system that comprises a stationary part and a moving part to project a plurality of radiation beams onto locations on a target of a substrate that are selected based on a pattern;
moving the substrate relative to the projection system in a scan direction such that the projection system can project onto successive scanning areas of the substrate; and
controlling the apparatus to operate in a first mode or a second mode,
wherein in the first mode the projecting delivers a first amount of energy to the selected locations, and in the second mode the projecting delivers a second amount of energy, which is greater than the first amount of energy, to the selected locations,
wherein in the first mode the substrate moves relative to the projection system at a first speed, and in the second mode the substrate moves relative to the projection system at a second speed, which is lower than the first speed, and
wherein in the first mode the projection system projects the plurality of radiation beams onto the selected locations at a first rate, and in the second mode the projection system projects the plurality of radiation beams onto the selected locations at a second rate, wherein (i) the second rate is lower than the first rate, or (ii) the second rate is substantially equal to or lower than the first rate and the second speed is lower than the first speed by an integer factor, or (iii) the second rate is substantially equal to or lower than the first rate and an intensity of radiation of the radiation beams projected onto the substrate is lower in the second mode than in the first mode.

15. The method of claim 14, wherein the second rate is lower than the first rate.

16. The method of claim 14, wherein each scanning area substantially abuts at least one other scanning area in the scan direction.

17. The apparatus of claim 1, wherein the control system is configured to control the apparatus such that the projection system projects each plurality of radiation beams onto any previously irradiated selected location in each scanning area.

18. The apparatus of claim 1, wherein the control system is configured to control the substrate support such that the substrate moves relative to the projection system at a substantially constant speed during irradiation of substantially all of the scanning areas.

19. The method of claim 14, wherein the second mode comprises a first sub-mode in which the second rate is substantially equal to the first rate and the second speed is lower than the first speed by the integer factor such that each scanning area partially overlaps an integer number of other scanning areas.

20. The method of claim 14, wherein the second mode comprises a second sub-mode in which the second rate is lower than the first rate by a slow-down factor and the second speed is lower than the first speed by the slow-down factor.

21. The method of claim 14, wherein the second mode comprises a third sub-mode in which the second rate is lower than the first rate by a slow-down factor and the second speed is lower than the first speed by the product of the slow-down factor and an integer factor, wherein each scanning area partially overlaps an integer number of other scanning areas.

22. The method of claim 14, wherein the second mode comprises a fourth sub-mode in which the second speed is lower than the first speed by an integer factor and the intensity of radiation of the radiation beams projected onto the substrate is lower in the fourth sub-mode than in the first mode.

* * * * *